(12) United States Patent
Wang

(10) Patent No.: US 11,036,320 B2
(45) Date of Patent: Jun. 15, 2021

(54) ORGANIC LIGHT EMITTING DIODE FOLDING DISPLAY

(71) Applicant: WUHAN CHINA STAR OPTOELECTRONICS SEMICONDUCTOR DISPLAY TECHNOLOGY CO., LTD., Hubei (CN)

(72) Inventor: Peng Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 4 days.

(21) Appl. No.: 16/477,891

(22) PCT Filed: Apr. 8, 2019

(86) PCT No.: PCT/CN2019/081768
§ 371 (c)(1),
(2) Date: Jul. 14, 2019

(87) PCT Pub. No.: WO2020/155380
PCT Pub. Date: Aug. 6, 2020

(65) Prior Publication Data
US 2020/0241676 A1 Jul. 30, 2020

(51) Int. Cl.
*H01L 27/00* (2006.01)
*G06F 3/041* (2006.01)
(Continued)

(52) U.S. Cl.
CPC .......... *G06F 3/0412* (2013.01); *H01L 27/322* (2013.01); *H01L 51/0097* (2013.01);
(Continued)

(58) Field of Classification Search
CPC .......... H01L 27/323; H01L 2251/5338; H01L 51/5253; H05K 1/028
See application file for complete search history.

(56) References Cited

U.S. PATENT DOCUMENTS 9,419,065 B2 * 8/2016 Degner ................. H01L 27/326
2015/0102326 A1 * 4/2015 An ....................... H01L 51/5253
257/40
(Continued)

FOREIGN PATENT DOCUMENTS

CN 107204402 A 9/2017
CN 108389881 A 8/2018
(Continued)

*Primary Examiner* — Fernando L Toledo
*Assistant Examiner* — Valerie N Newton
(74) *Attorney, Agent, or Firm* — Mark M. Friedman

(57) ABSTRACT

An organic light emitting diode (OLED) folding display including a back plater, a base substrate, a thin film transistor array layer, an OLED device layer, a thin film encapsulation layer, and a laminated structure sequentially disposed are provided. The laminated structure includes a touch layer including a first touch metal layer and a second touch metal layer, a color filter layer disposed between the first touch metal layer and the second touch metal layer, and a black matrix layer disposed on the first touch metal layer. Use of the adhesive layer is reduced, and an influence of a bending stress of the OLED folding display is improved.

20 Claims, 2 Drawing Sheets

(51) Int. Cl.
   *H01L 27/32*   (2006.01)
   *H01L 51/52*   (2006.01)
   *H01L 51/00*   (2006.01)

(52) U.S. Cl.
   CPC ...... *H01L 51/5253* (2013.01); *H01L 27/3272* (2013.01); *H01L 2251/5338* (2013.01)

(56) References Cited

U.S. PATENT DOCUMENTS

| | | |
|---|---|---|
| 2017/0097714 A1 | 4/2017 | Lee et al. |
| 2017/0213872 A1* | 7/2017 | Jinbo ................. H01L 51/0097 |
| 2018/0321778 A1 | 11/2018 | Lee et al. |
| 2018/0356859 A1* | 12/2018 | Hamburgen .......... G06F 1/1626 |
| 2018/0374906 A1* | 12/2018 | Everaerts ................ G06F 3/041 |
| 2019/0157609 A1* | 5/2019 | Suzuki ................ H01L 51/5246 |

FOREIGN PATENT DOCUMENTS

| | | |
|---|---|---|
| CN | 108803920 A | 11/2018 |
| KR | 20180045704 A | 5/2018 |

\* cited by examiner

US 11,036,320 B2

ORGANIC LIGHT EMITTING DIODE FOLDING DISPLAY

FIELD OF INVENTION

The present disclosure relates to the field of display technologies, and especially to an organic light emitting diode (OLED) folding display.

BACKGROUND OF INVENTION

Organic light emitting diode (OLED) display technologies use organic material coating layers and have self-emitting performances. OLED displays have large viewing angles, save energy, and have been widely used. The biggest feature of OLED displays is that it can realize flexible display. Foldable OLED displays are an important development direction in the present.

As illustrated in FIG. 1 and FIG. 2, a current OLED folding display 100 includes a back plate 11, a base substrate 13, a thin film transistor array layer 14, an OLED device layer 15, a thin film encapsulation layer 16, a polarizer 17, a touch screen 18, and a cover window 19 sequentially stacked. In FIG. 1, the back plate and the base substrate are adhered to each other using an optically clear adhesive (OCA) 121, the polarizer 17 and the thin film encapsulation layer 16 are adhered to each other using an OCA adhesive 122, the polarizer 17 and the touch screen 18 are adhered to each other using an OCA adhesive 123, the touch screen 18 and the cover window 19 are adhered to each other using an OCA adhesive 124. In FIG. 2, the polarizer 17 is replaced with a position of the touch screen 18, the back plate 11 and the base substrate 13 are adhered to each other using the OCA adhesive 121, the touch screen 18 and the thin film encapsulation layer 16 are adhered to each other using the OCA adhesive 122, the polarizer 17 and the touch screen 18 are adhered to each other using the OCA adhesive 123, the polarizer 17 and the cover window 19 are adhered to each other using the OCA adhesive 124. The OLED folding display 100 needs to control an overall thickness thereof to cause a neutral plane to be designed on the OLED device layer 15. However, when adjusting respective film layers positioned above and below the OLED device layer 15, an thickness adjustment for the back plate 11 is relatively easy, but the polarizer 17, the touch screen 18, and the cover window 19 are difficult to be thinned. Moreover, there are three layers including the OCA adhesive 122, the OCA adhesive 123, and the OCA adhesive 124 attached above to the OLED device layer 15, such that the OLED folding display 100 is difficult to rest and return to its original state after bending.

In the present, a center line A-A of the OLED device layer 15 in a stacked structure of the current OLED folding display 100 is not positioned at the neutral plane layer of an entire stacked structure, and a bending stress is large, this causes that the original state cannot be restored after bending.

Therefore, there is needed to provide a new OLED folding display to solve the above technical problems.

SUMMARY OF INVENTION

The present disclosure provides an organic light emitting diode (OLED) folding display, which solves a center line of an OLED device layer in an OLED folding display stack structure in the prior art is not positioned at a neutral plane layer of an entire stacked structure, and a bending stress is large, this causes a technical problem that an original state thereof cannot be restored after bending.

In order to solve the above issues, technical solutions provided in the present disclosure are as follows:

An embodiment of the present disclosure provides an organic light emitting diode (OLED) folding display, including:
a base substrate, wherein material of the base substrate includes polyimide;
a thin film transistor array layer disposed on the base substrate;
an OLED device layer disposed on the thin film transistor array layer;
a thin film encapsulation layer disposed on the OLED device layer;
a back plate disposed under the base substrate; and
a laminated structure disposed on the thin film encapsulation layer, the laminated structure including:
a touch layer including a first touch metal layer and a second touch metal layer;
a color filter layer disposed between the first touch metal layer and the second touch metal layer; and
a black matrix layer disposed on the first touch metal layer;
wherein the OLED folding display forms a neutral plane positioned at a center line of the OLED device layer.

In the OLED folding display provided by the embodiment of the present disclosure, the laminated structure further includes a protective film disposed under the second metal layer.

In the OLED folding display provided by the embodiment of the present disclosure, the laminated structure further includes a first inorganic layer and a second inorganic layer, the first inorganic layer is disposed above the black matrix layer, the second inorganic layer is disposed under the protective film.

In the OLED folding display provided by the embodiment of the present disclosure, materials of the first inorganic layer and the second inorganic layer include silicon nitride.

In the OLED folding display provided by the embodiment of the present disclosure, the laminated structure further includes a transparent substrate disposed above the first inorganic layer.

In the OLED folding display provided by the embodiment of the present disclosure, the laminate structure further includes a hard coat layer disposed above the transparent substrate.

In the OLED folding display provided by the embodiment of the present disclosure, the laminated structure and the thin film encapsulation layer are connected by an optically clear adhesive.

In the OLED folding display provided by the embodiment of the present disclosure, the base substrate and the back plate are connected by an optically clear adhesive.

In the OLED folding display provided by the embodiment of the present disclosure, material of the thin film transistor array layer includes low temperature polysilicon.

In the OLED folding display provided by the embodiment of the present disclosure, the color filter layer includes a plurality of color resists disposed on the second touch metal layer.

An embodiment of the present disclosure provides an organic light emitting diode (OLED) folding display, including:
a base substrate;
a thin film transistor array layer disposed on the base substrate;

an OLED device layer disposed on the thin film transistor array layer;

a thin film encapsulation layer disposed on the OLED device layer;

a back plate disposed under the base substrate; and a laminated structure disposed on the thin film encapsulation layer, the laminated structure including:

a touch layer including a first touch metal layer and a second touch metal layer;

a color filter layer disposed between the first touch metal layer and the second touch metal layer; and a black matrix layer disposed on the first touch metal layer;

wherein the OLED folding display forms a neutral plane positioned at a center line of the OLED device layer.

In the OLED folding display provided by the embodiment of the present disclosure, the laminate structure further includes a protective film disposed under the second metal layer.

In the OLED folding display provided by the embodiment of the present disclosure, the laminated structure further includes a first inorganic layer and a second inorganic layer, the first inorganic layer is disposed above the black matrix layer, the second inorganic layer is disposed under the protective film.

In the OLED folding display provided by the embodiment of the present disclosure, materials of the first inorganic layer and the second inorganic layer include silicon nitride.

In the OLED folding display provided by the embodiment of the present disclosure, the laminate structure further includes a transparent substrate disposed above the first inorganic layer.

In the OLED folding display provided by the embodiment of the present disclosure, material of the transparent substrate includes polyimide.

In the OLED folding display provided by the embodiment of the present disclosure, the laminate structure further includes a hard coat layer disposed above the transparent substrate.

In the OLED folding display provided by the embodiment of the present disclosure, the laminate structure and the thin film encapsulation layer are connected by an optically clear adhesive.

In the OLED folding display provided by the embodiment of the present disclosure, the base substrate and the back plate are connected by an optically clear adhesive.

In the OLED folding display provided by the embodiment of the present disclosure, material of the thin film transistor array layer includes low temperature polysilicon.

The beneficial effects of the embodiment of the present disclosure are as follow. The OLED folding display provided by the embodiment of the present disclosure reduces the adhesive layer while ensuring the optical and touch performances of the OLED folding display by adopting a special integrated stack structure design, and this causes the center line of the OLED device layer in the OLED folding display stack structure is as close as possible to the neutral plane of the OLED folding display stack structure, thereby improving an influence of bending stress on the OLED folding display.

DESCRIPTION OF DRAWINGS

The accompanying figures to be used in the description of embodiments of the present disclosure or prior art will be described in brief to more clearly illustrate the technical solutions of the embodiments or the prior art. Obviously, the accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
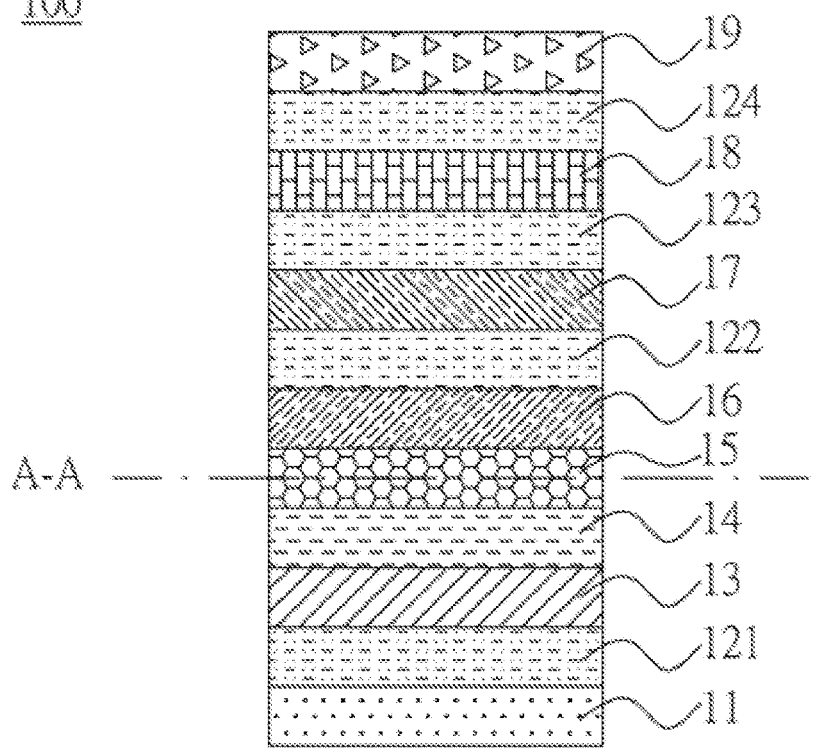
FIG. 1 is a schematic structural diagram of an organic light emitting diode (OLED) display folding display of the prior art.
Figure 2:
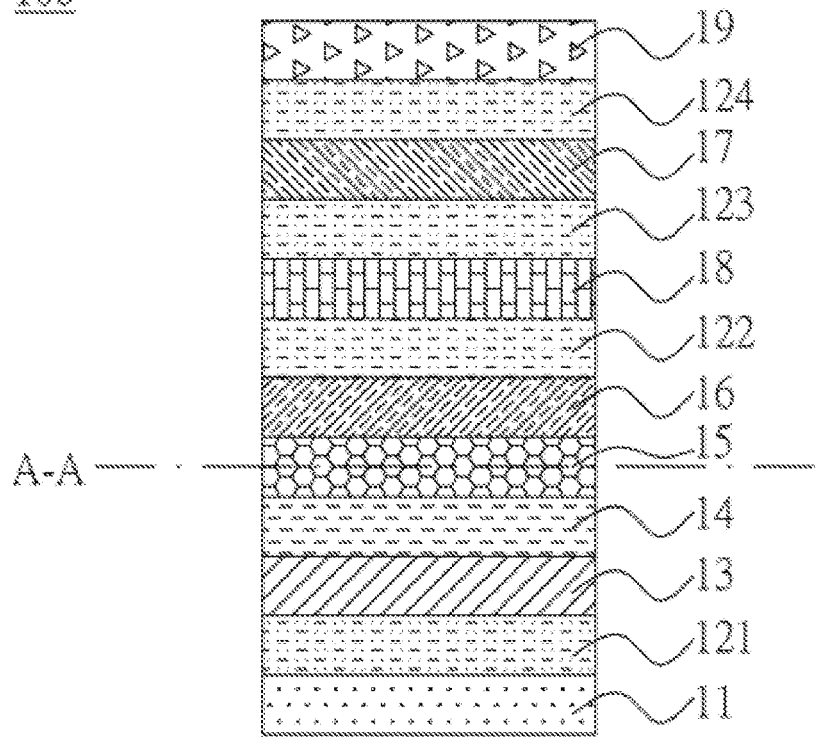
FIG. 2 is a schematic structural diagram of an OLED folding display of the prior art.

The following description of the various embodiments is provided to illustrate the specific embodiments. Directional terms described by the present disclosure, such as top, bottom, front, back, left, right, inner, outer, side, etc., are only directions by referring to the accompanying drawings, and thus the used terms are used only for the purpose of describing embodiments of the present disclosure and are not intended to be limiting of the present disclosure. In the drawings, units with similar structures are labeled with the same reference number.

An embodiment of the present disclosure is directed to an organic light emitting diode (OLED) device layer in an organic light emitting diode (OLED) folding display stack structure in the prior art that is not in a neutral plane layer of an entire stacked structure, and a bending stress is large, this causes that an original state thereof cannot be restored after bending, and this embodiment can solve the defect.

Figure 3:
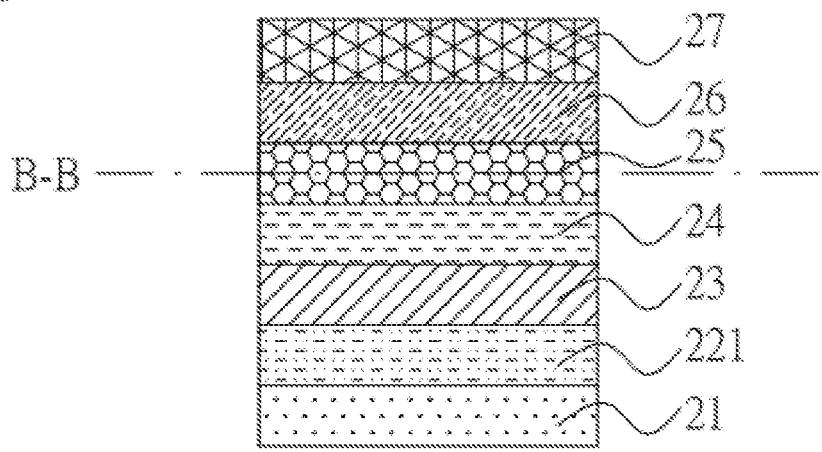
FIG. 3 is a schematic structural diagram of an OLED folding display of an embodiment of the present disclosure.

As illustrated in FIG. 3, an OLED folding display 200 provided by the embodiment of the present disclosure includes:

a base substrate 23;

a thin film transistor array layer 24 disposed on the base substrate 23;

an OLED device layer 25 disposed on the thin film transistor array layer 24; a thin film encapsulation layer 26 disposed on the OLED device layer 25;

a back plate 21 disposed under the base substrate 23; and a laminated structure 27 disposed on the thin film encapsulation layer 26;

wherein the OLED folding display 200 forms a neutral plane positioned at a center line B-B of the OLED device layer 25.

The neutral plane is, for example, a surface having no tension and no pressure, that is, a surface having zero strain during bending process of the OLED folding display, the film layer closer to the neutral plane has a smaller strain during the bending process, and the stress due to strain is smaller.

The base substrate 23 is a flexible substrate and has good bending ability, the polyimide (PI) is selected as material of the base substrate 23. Low temperature poly-silicon (LTPS) is selected as material of the thin film transistor array layer 24, compared with a current amorphous silicon material, the OLED folding display 200 fabricated with the LTPS is thinner and lighter.

The OLED device layer 25 includes a plurality of OLED display devices including an anode, a light-emitting functional layer, and a cathode electrically connected to the drain of the thin film transistor array layer 24. The anode, the light-emitting functional layer, and the cathode are sequentially stacked in a direction away from the base substrate 23.

The OLED device layer 25 is packaged in a thin film package to prevent water and oxygen from intruding into the OLED device layer 25.

The back plate 21 disposed under the base substrate 23, the back plate 21, and the base substrate 23 are adhered to each other using an optically clear adhesive (OCA) 221.

Figure 4:
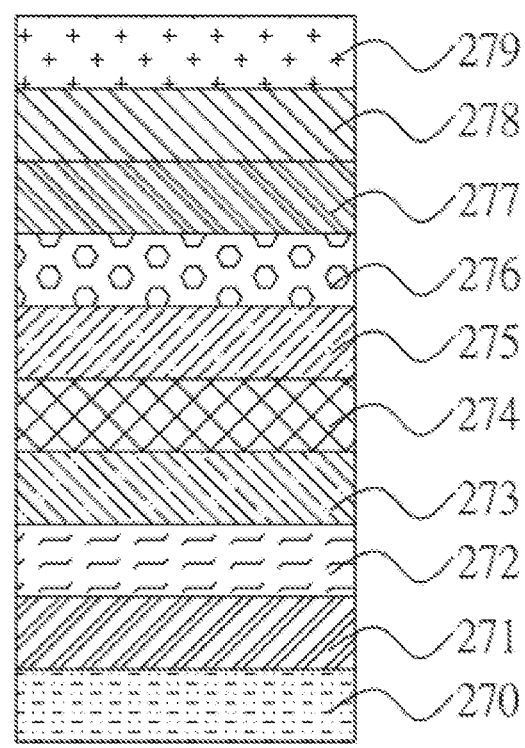
FIG. 4 is a schematic structural diagram of an OLED folding display of an embodiment of the present disclosure.

As illustrated in FIG. 4, the OLED folding display 200 includes a laminated structure 27 adopted a special integrated stack structure design. The laminated structure 27 is disposed above the thin film encapsulation layer 26, and the laminated structure 27 is adhered to the thin film encapsulation layer 26 using a layer of OCA adhesive 270. The laminated structure 27 further includes a touch layer, a color filter layer 274, and a black matrix layer 276. In details, the touch layer includes a first touch metal layer 275 and a second touch metal layer 273. The first touch metal layer 275 is disposed above the second touch metal layer 273, the color filter layer 274 is disposed between the first touch metal layer 275 and the second touch metal layer 273, and the color filter layer 274 includes a plurality of color resists disposed on the second touch metal layer 273. The color resists include red color resist, green color resist, and blue color resist to prevent light reflection. The back matrix layer 276 is disposed on the first touch metal layer 275, and the black matrix layer 276 is used to block adjacent light of different color resistive boundaries. Because the first touch metal layer 275 and the second touch metal layer 273 are separated by an organic layer, space between the both layers is relatively long, and a load is small, such that an integrated touch performance of the touch layer is better. In addition, the color filter layer 274 can prevent reflection of light, and can not only function as a polarizer, but the color filter layer 274 is disposed between the first touch metal layer 275 and the second touch metal layer 273, therefore there is no need to use an adhesive layer between the color filter layer 274 and the touch layer, thereby reducing a thickness of the laminate structure 27, thereby reducing the thickness of the film layer structure disposed above the OLED device layer 25 of the OLED folding display 200, such that a center line B-B of the OLED device layer 25 is easily close coincide with the neutral plane of the stacked structure of the OLED folding display 200, and the bending stress of the OLED folding display 200 is reduced.

A protective film (that is over coating) 272 is disposed under the second touch metal layer 273 configured to protect the second touch metal layer 273 from corrosion. Meanwhile, a thickness of the protective film 272 can be adjustment, space between the touch layer and the cathode of the OLED device layer 25 can be optimized to reduce a load, therefore a touch performance of the touch layer is better. Further, because the thickness of the protective film 272 can be adjusted, when the thickness of the film structure disposed under the center line B-B of the OLED device layer 25 is thick, that is, when the neutral plane of the stacked structure of the OLED folding display 200 is disposed under the center line BB of the OLED device layer 25, the neutral plane of the stacked structure of the OLED folding display 200 can be reduced by reducing the thickness of the protective film 272. The center line B-B of the OLED device layer 25 is overlapped, such that the bending stress of the OLED folding display 200 is minimized. Similarly, when the neutral plane of the stacked structure of the OLED folding display 200 is disposed above the center line B-B of the OLED device layer 25, the thickness of the protective film 272 can be appropriately increased to satisfy requirements.

Furthermore, the laminated structure 27 further includes a first inorganic layer 277 and a second inorganic layer 271. The first inorganic layer 277 is disposed above the black matrix layer 276, and the second inorganic layer 271 is disposed under the protective film 272. Materials of the first inorganic layer 77 and the second inorganic layer 271 are both dense inorganic materials, optionally silicon nitride materials. An arrangement of the first inorganic layer 277 and the second inorganic layer 271 can protect the touch layer, that is, the first touch metal layer 275 and the second touch metal layer 273 are respectively protected from water and oxygen corrosion, thereby increasing a life of the touch layer. In the meantime, because both above and below sides of the first inorganic layer 277 and the second inorganic layer 271 are organic materials, it is easy to alleviate a stress applied to the first inorganic layer 277 and the second inorganic layer 271, to improve its resistance to bending.

Furthermore, a transparent substrate 278 is disposed above the first inorganic layer 277, such that the film structure of the laminated structure 27 is entirely attached to the transparent substrate 278. Materials of the transparent substrate 278 and the base substrate 23 are both selected as PI materials. Because the PI material is a flexible material, a bending ability of the transparent substrate 278 can be made better, thereby contributing to improve a bending performance of the OLED folding display 200. In addition, a hard coating 279 may be disposed on the transparent substrate 278 configured to protect the laminated structure 27 from damage.

The laminated structure 27 is reduced from a three-layer adhesive material to only one layer of the OCA adhesive 270, which greatly reduces the adhesive material, compared to the film layer structure disposed above the OLED device layer of the current OLED folding display, such that the OLED folding display 200 is allowed to rest and return to its original state after bending. In addition, the laminated structure 27 avoids a structure that is not easily thinned such as a polarizer, a cover window, etc., the color filter layer 274 is used to replace the polarizer, and the color filter layer 274 disposed between the two touch metal layers, this not only the optical effect is ensured, but also the touch effect is optimized, and the film structure in the laminated structure 27 is easily thinned, such that the thickness adjustment become more easily, and the neutral plane of the stacked structure of the OLED folding display 200 is easily coincide with the center line B-B of the OLED device layer 25.

The beneficial effects of the embodiment of the present disclosure are as follow. The OLED folding display provided by the embodiment of the present disclosure reduces the adhesive layer while ensuring the optical and touch performances of the OLED folding display by adopting the integrated stack structure, this cause the center line of the OLED device layer in the OLED folding display stack structure is as close as possible to the neutral plane of the OLED folding display stack structure, thereby improving the influence of bending stress on the OLED folding display.

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. An organic light emitting diode (OLED) folding display, comprising:

a base substrate, wherein material of the base substrate comprises polyimide;
a thin film transistor array layer disposed on the base substrate;
an OLED device layer disposed on the thin film transistor array layer;
a thin film encapsulation layer disposed on the OLED device layer;
a back plate disposed under the base substrate; and
a laminated structure disposed on the thin film encapsulation layer, the laminated structure comprising:
a touch layer, comprising a first touch metal layer and a second touch metal layer;
a color filter layer, disposed between the first touch metal layer and the second touch metal layer; and
a black matrix layer disposed on the first touch metal layer;
wherein the OLED folding display forms a neutral plane positioned at a center line of the OLED device layer;
wherein a configuration of the color filter layer disposed between the first touch metal layer and the second touch metal layer causes a center line of the OLED device layer to approximately coincide with the neutral plane of the stacked structure of the OLED folding display.

2. The OLED folding display as claimed in claim 1, wherein the laminated structure further comprises a protective film disposed under the second metal layer.

3. The OLED folding display as claimed in claim 2, wherein the laminated structure further comprises a first inorganic layer and a second inorganic layer, the first inorganic layer is disposed above the black matrix layer, the second inorganic layer is disposed under the protective film.

4. The OLED folding display as claimed in claim 3, wherein materials of the first inorganic layer and the second inorganic layer comprise silicon nitride.

5. The OLED folding display as claimed in claim 3, wherein the laminated structure further comprises a transparent substrate disposed above the first inorganic layer.

6. The OLED folding display as claimed in claim 5, wherein the laminate structure further comprises a hard coat layer disposed above the transparent substrate.

7. The OLED folding display as claimed in claim 1, wherein the laminated structure and the thin film encapsulation layer are connected by an optically clear adhesive.

8. The OLED folding display as claimed in claim 1, wherein the base substrate and the back plate are connected by an optically clear adhesive.

9. The OLED folding display as claimed in claim 1, wherein material of the thin film transistor array layer comprises low temperature polysilicon.

10. The OLED folding display as claimed in claim 1, wherein the color filter layer comprises a plurality of color resists disposed on the second touch metal layer.

11. An organic light emitting diode (OLED) folding display, comprising:
a base substrate;
a thin film transistor array layer disposed on the base substrate;
an OLED device layer disposed on the thin film transistor array layer;
a thin film encapsulation layer disposed on the OLED device layer;
a back plate disposed under the base substrate; and
a laminated structure disposed on the thin film encapsulation layer, the laminated structure comprising:
a touch layer comprising a first touch metal layer and a second touch metal layer;
a color filter layer disposed between the first touch metal layer and the second touch metal layer; and
a black matrix layer disposed on the first touch metal layer;
wherein the OLED folding display forms a neutral plane positioned at a center line of the OLED device layer;
wherein a configuration of the color filter layer disposed between the first touch metal layer and the second touch metal layer causes a center line of the OLED device layer to approximately coincide with the neutral plane of the stacked structure of the OLED folding display.

12. The OLED folding display as claimed in claim 11, wherein the laminate structure further comprises a protective film disposed under the second touch metal layer.

13. The OLED folding display as claimed in claim 12, wherein the laminated structure further comprises a first inorganic layer and a second inorganic layer, the first inorganic layer is disposed above the black matrix layer, the second inorganic layer is disposed under the protective film.

14. The OLED folding display as claimed in claim 13, wherein materials of the first inorganic layer and the second inorganic layer comprise silicon nitride.

15. The OLED folding display as claimed in claim 13, wherein the laminate structure further comprises a transparent substrate disposed above the first inorganic layer.

16. The OLED folding display as claimed in claim 15, wherein material of the transparent substrate comprises polyimide.

17. The OLED folding display as claimed in claim 15, wherein the laminate structure further comprises a hard coat layer disposed above the transparent substrate.

18. The OLED folding display as claimed in claim 11, wherein the laminate structure and the thin film encapsulation layer are connected by an optically clear adhesive.

19. The OLED folding display as claimed in claim 11, wherein the base substrate and the back plate are connected by an optically clear adhesive.

20. The OLED folding display as claimed in claim 11, wherein material of the thin film transistor array layer comprises low temperature polysilicon.

* * * * *